(12) United States Patent
Zheng et al.

(10) Patent No.: US 8,178,952 B2
(45) Date of Patent: May 15, 2012

(54) METHOD OF FORMING HIGH-K DUAL DIELECTRIC STACK

(75) Inventors: Jun-Fei Zheng, Westport, CT (US); George Chen, Los Gatos, CA (US); Wilman Tsai, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 701 days.

(21) Appl. No.: 12/229,624

(22) Filed: Aug. 26, 2008

(65) Prior Publication Data

US 2009/0004882 A1    Jan. 1, 2009

Related U.S. Application Data

(62) Division of application No. 11/772,030, filed on Jun. 29, 2007, now Pat. No. 7,834,426.

(51) Int. Cl.
*H01L 23/58* (2006.01)
(52) U.S. Cl. .................................................. 257/635
(58) Field of Classification Search .............. 257/635
See application file for complete search history.

(56) References Cited

U.S. PATENT DOCUMENTS

| | | | |
|---|---|---|---|
| 4,811,077 A | 3/1989 | Fowler et al. | |
| 7,163,860 B1 | 1/2007 | Kamal et al. | |
| 2003/0137018 A1* | 7/2003 | Passlack et al. | 257/410 |
| 2003/0219994 A1* | 11/2003 | Goodhue | 438/767 |
| 2006/0131652 A1 | 6/2006 | Li | |
| 2007/0069240 A1* | 3/2007 | Passlack | 257/192 |
| 2007/0082505 A1* | 4/2007 | Abrokwah et al. | 438/778 |
| 2008/0003752 A1 | 1/2008 | Metz et al. | |

* cited by examiner

*Primary Examiner* — David Vu
*Assistant Examiner* — Brandon Fox
(74) *Attorney, Agent, or Firm* — Blakely, Sokoloff, Taylor & Zafman LLP

(57) ABSTRACT

The present invention discloses a method including: providing a Group III-V component semiconductor material; forming a first layer over a surface of the Group III-V component semiconductor material, the first layer to unpin a Fermi level at the surface; forming a second layer over the first layer, the second layer for scaling an equivalent oxide thickness (EOT); and annealing the first layer before or after forming the second layer to remove bulk trap defects in the first layer.

19 Claims, 1 Drawing Sheet

METHOD OF FORMING HIGH-K DUAL DIELECTRIC STACK

CLAIM OF PRIORITY

This is a Divisional Application of U.S. patent application Ser. No. 11/772,030, filed on Jun. 29, 2007 now U.S. Pat. No. 7,834,426.

BACKGROUND OF THE INVENTION

1. Field of the Invention

The present invention relates to a field of semiconductor integrated circuit (IC) manufacturing, and more specifically, to a device having and a method of forming a high-k dual dielectric stack.

2. Discussion of Related Art

An integrated circuit (IC) may include various active devices and passive devices. In particular, the IC may be designed using a complementary metal-oxide-semiconductor (CMOS) technology that includes an NMOS transistor and a PMOS transistor. Other devices, such as resistors, capacitors, and inductors, may also be included.

A scaling down of dimensions of the integrated circuit (IC) depends on a combination of technical and economic factors. For over 40 years, Moore's Law has accurately tracked a doubling in density of the IC every 18 months.

The transistors may be fabricated in a substrate on a wafer. The substrate may be formed from a semiconductor material, such as Silicon. The transistors have a gate dielectric film. The gate dielectric film may be formed from an oxidation of the Silicon or by deposition of a dielectric on the Silicon. The oxidation may be performed thermally. The resultant gate oxide, such as $SiO_2$, has a dielectric constant, k, with a value of 3.9.

Scaling down each succeeding generation of the IC requires a reduction in channel length and gate dielectric film thickness. However, leakage current will also become larger.

In particular, a need exists for a gate dielectric film that is formed from a material with a higher value of k than the $SiO_2$.

The advancement of Moore's law may require other materials to replace Silicon. However, the formation of high-k dielectric directly on Group III-V semiconductors may result in pinning of a Fermi-level at a surface.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a method of forming a high-k dual dielectric stack and a device having the high-k dual dielectric stack.

Figure 1:
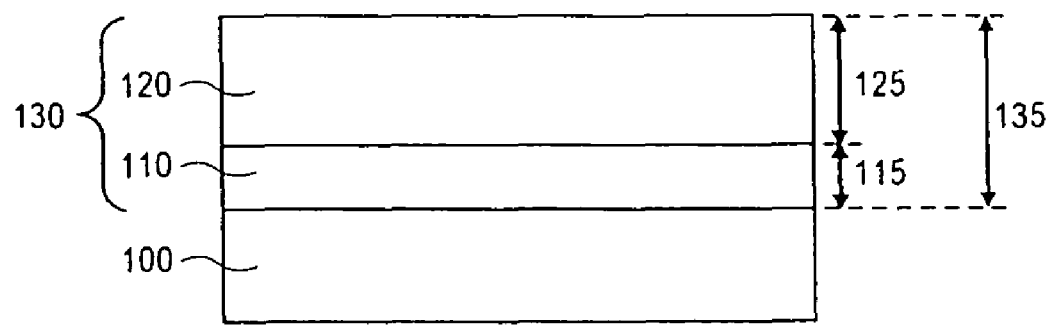
FIG. 1 shows a device with a high-k dual dielectric stack according to an embodiment of the present invention.

As shown in an embodiment of the present invention in FIG. 1, a first layer 110 may be formed over a surface of a Group III-V component semiconductor material 100. The first layer 110 may include a dielectric material that may unpin a Fermi level at a surface of the Group III-V component semiconductor material 100.

The first layer 110 may have a very limited thickness 115. The first layer may be ultra thin. In an embodiment of the present invention, the first layer may have a unit cell or monolayer thickness.

Next, a second layer 120 is formed over the first layer 110 to form a high-k dual dielectric stack 130. The second layer 120 should be chemically and physically compatible with the first layer 110. The second layer 120 should be robust so as to protect the first layer 110. The second layer 120 should have a high dielectric constant k so an appropriate thickness 125 may be selected to allow scaling of an equivalent oxide thickness (EOT) 135 for the high-k dual dielectric stack 130.

Figure 2:
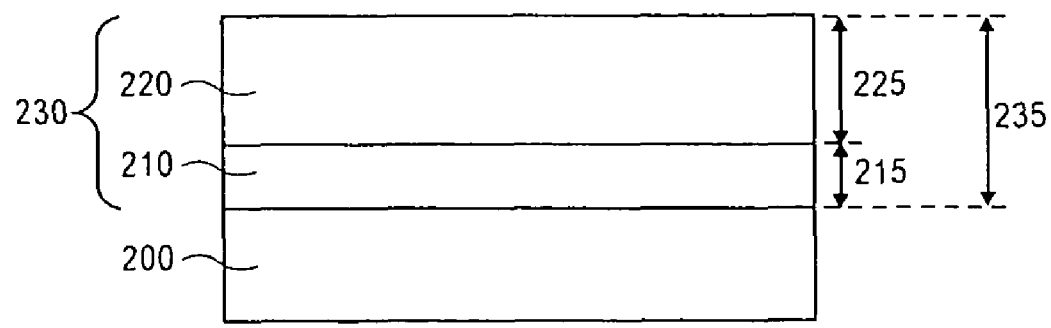
FIG. 2 shows a device with a high-k dual dielectric stack with a composite first gate dielectric according to an embodiment of the present invention.

As shown in an embodiment of the present invention in FIG. 2, a first layer 210 may be formed over the surface of the Group III-V component semiconductor material 200. The first layer 210 may include a composite of two or more different dielectric materials, each of which may unpin the Fermi level at the surface of the Group III-V component semiconductor material 200.

In an embodiment of the present invention, the composite may be a homogeneous material with uniform properties.

In an embodiment of the present invention, the composite may be a heterogeneous material with discrete regions that differ in characteristics.

The first layer 210 may have a very limited thickness. The first layer 210 may be ultra thin. In an embodiment of the present invention, the first layer 210 may have a unit cell or monolayer thickness.

In an embodiment of the present invention, the formation of the composite of two or more different dielectric materials for the first layer 210 may be performed by co-deposition, such as by e-beam evaporation.

Next, a second layer 220 is formed over the first layer 210 to form a high-k dual dielectric stack 230. The second layer 220 should be chemically and physically compatible with the first layer 210. The second layer 220 should be robust so as to protect the first layer 210. The second layer 220 should have a high dielectric constant k so an appropriate thickness 225 may be selected to allow scaling of an equivalent oxide thickness (EOT) 235 for the high-k dual dielectric stack 230.

In an embodiment of the present invention, the first layer 210 may include Gadolinium Gallium Garnet (GGG) or $Gd_2O_3(Ga_2O_3)$ while the second layer 220 may include Silicon Nitride or $Si_3N_4$. The second layer 220 may be formed by jet vapor deposition (JVD). The jet vapor-deposited $Si_3N_4$ film is compatible with the $Gd_2O_3(Ga_2O_3)$.

An anneal temperature for the second layer 220 may depend on a stability of the first layer 210. The temperature limitation for the $Si_3N_4$ directly deposited on the Group III-V component semiconductor material 200 may only be 400-500 degrees Centigrade which is too low to achieve the best characteristics of the $Si_3N_4$.

However, an interface between the $Gd_2O_3(Ga_2O_3)$ and the Group III-V component semiconductor material 200 may remain stable up to an annealing temperature of 780 degrees Centigrade. Consequently, the temperature limitation for the $Si_3N_4$ deposited on the $Gd_2O_3(Ga_2O_3)$ as a buffer layer for the Group III-V component semiconductor material 200 may be as high as 750 degrees Centigrade.

The impact of bulk trap defects in the first layer 210 may be minimized by selecting the ultra-thin or unit cell configuration of the first layer 210 since such a layer would contain a very few absolute number of bulk trap defects. This allows a selection of a bulk-trap-defect-free second dielectric 220 without significant concern regarding an ability of the second dielectric 220 to unpin the surface Fermi-level of the Group III-V component semiconductor material.

The bulk trap defects in the first layer 210 may be removed by annealing, either before or after forming the second layer 220 over the first layer 210.

Should an imperfection exist in the first layer dielectric 210, an infusion of the second layer dielectric 220 into the first layer 210 may repair the bulk trap defect or other imperfection in the underlying first layer 210. The first layer 210 may have properties that would allow formation of a device that is compatible with CMOS technology.

In an embodiment of the present invention, a cluster tool may be used for formation of the high-k dual dielectric stack 230 of the present invention. After formation of the first layer 210 in a first chamber, the Group III-V component semiconductor material 200 may be transferred to a second chamber for depositing the second layer 220 in-situ so that the underlying first layer 210 would not be exposed to ambient, unlike in an ex-situ process, and thus would be protected from possible degradation, such as by absorbing or reacting with air or water.

The selection of a thicker-than-monolayer second dielectric 220 will provide a robust process for CMOS as it may protect the first dielectric 210 from the moisture and chemical impacts of the process.

The present invention also envisions a high-k dual dielectric stack 230, such as for a depletion-mode or an enhancement-mode device. The high-k dual dielectric stack 230 includes a second layer 220 formed on a first layer 210. The first layer 210 may include Gadolinium Gallium Garnet (GGG) or $Gd_2O_3(Ga_2O_3)$ while the second layer 220 may include $Si_3N_4$, such as may be formed by jet vapor deposition (JVD).

The Fermi level at the surface of the Group III-V component semiconductor material 200 is normally pinned such that there is no surface channel inversion. Such a surface channel inversion is needed for operation of an enhancement-mode device thus limiting an ability to use the Group III-V component semiconductor 200 to replace Silicon to form a transistor for CMOS technology. Not many high-k dielectric materials can unpin a Fermi level at the surface of the Group III-V component semiconductor material 200.

One of the few possible candidate materials includes Gadolinium Gallium Garnet (GGG) or $Gd_2O_3(Ga_2O_3)$. However, the properties of the $Gd_2O_3(Ga_2O_3)$ material may need to be optimized.

In an embodiment of the present invention, the ratio of Gadolinium to Gallium in the first layer 210 may be altered to unpin the Fermi level at the surface of the Group III-V component semiconductor material 200.

In an embodiment of the present invention, an internal crystalline structure of the $Gd_2O_3(Ga_2O_3)$ material may be optimized.

In an embodiment of the present invention, an external surface morphology of the $Gd_2O_3(Ga_2O_3)$ material may be optimized.

Processing issues for the $Gd_2O_3(Ga_2O_3)$ material may also have to be addressed.

First, the $Gd_2O_3(Ga_2O_3)$ material which is too thin may be unstable due to absorption of moisture from the ambient or due to a sensitivity to a chemical during processing.

Second, the $Gd_2O_3(Ga_2O_3)$ material may only have a k value of 13-15, or a relative k-value to that of Silicon Oxide of 3.33-3.84, which may be too small to scale the EOT down to 3 nm or less.

Third, the $Gd_2O_3(Ga_2O_3)$ material may include many bulk trap defects due to deposition by e-beam evaporation on the surface of the Group III-V component semiconductor material 200.

The layer of $Si_3N_4$ may be free of pinholes even with a thickness of only 1-2 nm. Thus, the $Si_3N_4$ may protect the $Gd_2O_3(Ga_2O_3)$ material from moisture or a chemical during processing.

Scaling of the EOT 235 for the high-k dual dielectric stack 230 may be performed by selecting a thickness 225 of the second layer 220 since it will dominate the thickness 215 of the first layer 210.

In an embodiment of the present invention, the EOT 215 may be 3.30-3.75 nm for the first layer 210. In an embodiment of the present invention, the EOT 225 may be 1.70-2.00 nm for the second layer 220. In an embodiment of the present invention, the EOT 235 may be 5.00-5.75 nm for the high-k dual dielectric stack 230 of $Gd_2O_3(Ga_2O_3)/Si_3N_4$.

In an embodiment of the present invention, the EOT 215 may be 1.65-1.88 nm for the first layer 210. In an embodiment of the present invention, the EOT 225 may be 0.85-1.00 nm for the second layer 220. In an embodiment of the present invention, the EOT 235 may be 2.50-2.88 nm for the high-k dual dielectric stack 230 of $Gd_2O_3(Ga_2O_3)/Si_3N_4$.

In an embodiment of the present invention, the first layer 210 is a monolayer. In an embodiment of the present invention, the EOT 225 may be about 1.00 nm for the second layer 220. In an embodiment of the present invention, the EOT 235 may be about 2.00 nm for the high-k dual dielectric stack 230 of $Gd_2O_3(Ga_2O_3)/Si_3N_4$.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. A method comprising:
   providing a Group III-V component semiconductor material to form a transistor for CMOS technology;
   forming a first layer over said Group III-V component semiconductor material, said first layer comprising an oxide of gadolinium and an oxide of gallium, said first layer to prevent pining a Fermi level at said surface;
   forming in-situ a second layer over said first layer, said second layer for scaling an equivalent oxide thickness (EOT);
   annealing said first layer before or after forming said second layer to remove bulk trap defects in said first layer; and
   forming a gate electrode above said second layer over said first layer wherein said second layer is interposed between the first layer and the gate electrode.

2. The method of claim 1 wherein said first layer comprises a heterogeneous material.

3. The method of claim 1 wherein said first layer has a unit cell thickness.

4. The method of claim 1 wherein said forming of said first layer comprises a co-deposition of two or more different dielectric materials.

5. A method comprising:
   forming a Group III-V component semiconductor material; and
   forming a high-k dual dielectric stack over said Group III-V component semiconductor material, wherein said high-k dual dielectric stack comprises: a first layer the first layer comprising a heterogeneous material with discrete regions of oxides of gallium and oxides of gadolinium, said first layer to prevent pining a Fermi level at a surface of said Group III-V component semiconductor material; and a second layer disposed over said first layer, said second layer for scaling an equivalent oxide thickness (EOT); and
   forming a gate electrode above said second layer disposed over said first layer wherein said second layer is interposed between the first layer and the gate electrode.

6. The method of claim 5 wherein said first layer comprises a composite.

7. The method of claim 5 wherein said second layer comprises a high-k dielectric with an EOT of 1.00 nm.

8. The method of claim 5 wherein said high-k dual dielectric stack comprises an EOT of 2.00 nm.

9. A method comprising:
   forming a first layer comprising an oxide of gallium and an oxide of gadolinium over a Group III-V component semiconductor material; and
   forming a second layer consisting of silicon nitride directly on said first layer.

10. The method of claim 9 wherein said first layer is a monolayer thick.

11. The method of claim 9 wherein the first layer comprises Gadolinium Gallium Garnet (GGG).

12. The method of claim 9 wherein the equivalent oxide thickness (EOT) of said first layer and said second layer is between 2.5 to 2.8 nanometers.

13. The method of claim 9 wherein the equivalent oxide thickness (EOT) of said first layer and said second layer is about 2.0 nanometers.

14. The method of claim 9 wherein forming said first layer comprises co-depositing said oxide of gallium and said oxide of gadolinium.

15. The method of claim 14 wherein said oxide of gallium and said oxide of gadolinium are formed by e-beam evaporation.

16. The method of claim 9 wherein said second layer is formed by jet vapor deposition.

17. The method of claim 9 further comprising annealing said first layer prior to forming said second layer.

18. The method of claim 9, after forming said second layer annealing said first layer.

19. The method of claim 9 further comprising forming gate electrode above second layer.

* * * * *